United States Patent
Chandra et al.

(10) Patent No.: US 9,287,399 B2
(45) Date of Patent: Mar. 15, 2016

(54) FACETED INTRINSIC EPITAXIAL BUFFER LAYER FOR REDUCING SHORT CHANNEL EFFECTS WHILE MAXIMIZING CHANNEL STRESS LEVELS

(71) Applicant: International Business Machines Corporation, Armonk, NY (US)

(72) Inventors: Bhupesh Chandra, Jersey City, NJ (US); Paul Chang, Mahopac, NY (US); Gregory G. Freeman, Hopewell Junction, NY (US); Dechao Guo, Fishkill, NY (US); Judson R. Holt, Wappingers Falls, NY (US); Arvind Kumar, Chappaqua, NY (US); Timothy J. McArdle, Hopewell Junction, NY (US); Shreesh Narasimha, Beacon, NY (US); Viorel Ontalus, Danbury, CT (US); Sangameshwar Saudari, Hopewell Junction, NY (US); Christopher D. Sheraw, Wappingers Falls, NY (US); Matthew W. Stoker, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/508,196

(22) Filed: Oct. 7, 2014

(65) Prior Publication Data

US 2015/0084096 A1    Mar. 26, 2015

Related U.S. Application Data

(62) Division of application No. 13/839,741, filed on Mar. 15, 2013, now Pat. No. 8,940,595.

(51) Int. Cl.
*H01L 29/66* (2006.01)
*H01L 29/78* (2006.01)
*H01L 29/04* (2006.01)
*H01L 29/165* (2006.01)
*H01L 29/36* (2006.01)

(52) U.S. Cl.
CPC .......... *H01L 29/7848* (2013.01); *H01L 29/045* (2013.01); *H01L 29/165* (2013.01); *H01L 29/36* (2013.01); *H01L 29/66636* (2013.01); *H01L 29/7834* (2013.01)

(58) Field of Classification Search
CPC ............................... H01L 21/00; H01L 29/00
USPC ........... 257/E21.409, E29.255, E21.431, 190, 257/192
See application file for complete search history.

(56) References Cited

U.S. PATENT DOCUMENTS

| | | | |
|---|---|---|---|
| 8,222,673 B2 | 7/2012 | Greene et al. | |
| 8,598,009 B2 | 12/2013 | Greene et al. | |
| 8,815,656 B2 | 8/2014 | Adam et al. | |
| 2008/0145986 A1 | 6/2008 | Chidambarrao et al. | |
| 2011/0298008 A1 | 12/2011 | Greene et al. | |
| 2012/0208337 A1 | 8/2012 | Greene et al. | |

*Primary Examiner* — Telly Green
(74) *Attorney, Agent, or Firm* — Scully, Scott, Murphy & Presser, P.C.; Joseph Petrokaitis, Esq.

(57) ABSTRACT

A faceted intrinsic buffer semiconductor material is deposited on sidewalls of a source trench and a drain trench by selective epitaxy. A facet adjoins each edge at which an outer sidewall of a gate spacer adjoins a sidewall of the source trench or the drain trench. A doped semiconductor material is subsequently deposited to fill the source trench and the drain trench. The doped semiconductor material can be deposited such that the facets of the intrinsic buffer semiconductor material are extended and inner sidewalls of the deposited doped semiconductor material merges in each of the source trench and the drain trench. The doped semiconductor material can subsequently grow upward. Faceted intrinsic buffer semiconductor material portions allow greater outdiffusion of dopants near faceted corners while suppressing diffusion of dopants in regions of uniform width, thereby suppressing short channel effects.

16 Claims, 8 Drawing Sheets

FACETED INTRINSIC EPITAXIAL BUFFER LAYER FOR REDUCING SHORT CHANNEL EFFECTS WHILE MAXIMIZING CHANNEL STRESS LEVELS

BACKGROUND

The present disclosure generally relates to semiconductor devices, and particularly to field effect transistors including an embedded source/drain region that contains a graded-doping semiconductor material portion, and methods of manufacturing the same.

A "late epitaxy process," in which formation of deep source and drain regions is performed after formation of source and drain extension regions, provides advantage over an "early epitaxy process" by enabling as-grown doping of the deep source and drain regions. The early epitaxy process refers to an epitaxy process that is followed by deep source/drain implantation and an activation anneal at a relatively high temperature. The late epitaxy process eliminates the need for deep source/drain implantation, which could relax the epitaxial stress provided by epitaxially grown deep source and drain regions. Late epitaxy can thus allow a higher level of stress to be applied to the channel region of a field effect transistor. The late epitaxy process can also provide various additional advantages.

To provide a low on-resistance for a field effect transistor (FET), hence a high performance FET, a high level dopant concentration and/or a high level of dopant activation are needed in the source and drain regions. However, the increase in the dopant concentration can cause short channel effects through degraded junction profile. Furthermore, a higher level of dopant activation requires an anneal at a higher temperature, which also degrades the junction profile. Thus, the dopants in the source and drain regions need to be activated with minimum degradation in the junction profile in order to minimize short channel effects degrade.

To improve carrier mobility and hence improve FET performance, a high stress level in the FET conduction channel is needed. While the increase in the stress level is possible by increasing the volume of epitaxial stressor materials in embedded source and drain regions, incorporation of more embedded stressor materials requires reducing proximity between the embedded source and drain regions. The close proximity between source and drain causes degraded short channel effects.

In view of the difficulties in enhancing performance of field effect transistors through embedded source and drain stressor materials, a method to minimize the short channel effect while maximizing the stress effects of embedded source and drain region is desired.

SUMMARY

A faceted intrinsic buffer semiconductor material is deposited on sidewalls of a source trench and a drain trench by selective epitaxy. A facet adjoins each edge at which an outer sidewall of a gate spacer adjoins a sidewall of the source trench or the drain trench. A doped semiconductor material is subsequently deposited to fill the source trench and the drain trench. The doped semiconductor material can be deposited such that the facets of the intrinsic buffer semiconductor material are extended and inner sidewalls of the deposited doped semiconductor material merges in each of the source trench and the drain trench. The doped semiconductor material can subsequently grow upward above the plane including the interface between a gate dielectric and the body region of the field effect transistor. Faceted intrinsic buffer semiconductor material portions allow greater outdiffusion of dopants near faceted corners while suppressing diffusion of dopants in regions of uniform width, thereby suppressing short channel effects.

According to an aspect of the present disclosure, a method of forming a semiconductor structure is provided. A trench having a vertical sidewall is formed in a semiconductor substrate. The vertical sidewall extends downward from a top surface of the semiconductor substrate. A stress-generating semiconductor material is deposited in the trench by a first selective epitaxy process. A faceted surface of the stress-generating semiconductor material and the vertical sidewall are adjoined at an edge. A doped semiconductor material is deposited by an in-situ doped selective epitaxy process. The trench is filled with the stress-generating semiconductor material and the doped semiconductor material.

According to another aspect of the present disclosure, a semiconductor structure is provided. The semiconductor structure includes a trench located in a single crystalline semiconductor material layer. A graded-doping semiconductor material portion is located in the trench. The graded-doping semiconductor material portion is epitaxially aligned to the single crystalline semiconductor material layer, includes a faceted surface that adjoins a topmost portion of a vertical sidewall of the trench at an edge, and has a gradient in a dopant concentration. A doped semiconductor material portion is embedded in the graded-doping semiconductor material portion and protrudes above the trench. The doped semiconductor material portion is epitaxially aligned to the graded-doping semiconductor material portion, and is spaced from the single crystalline semiconductor material layer by the graded-doping semiconductor material portion.

DETAILED DESCRIPTION

Figure 1:
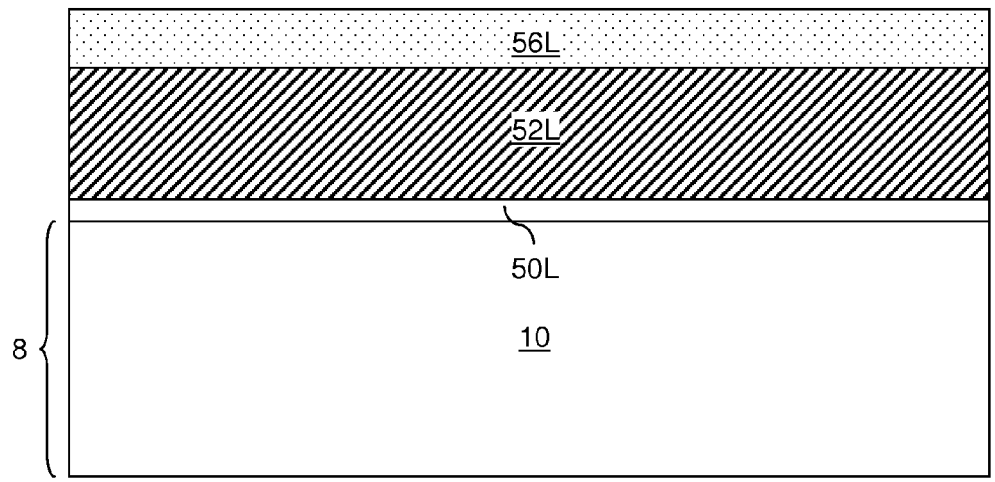
FIG. 1 is a vertical cross-sectional view of a first exemplary semiconductor structure after formation of a gate dielectric layer, a gate conductor layer, and a gate cap dielectric layer according to an embodiment of the present disclosure.

As stated above, the present disclosure relates to field effect transistors including an embedded source/drain region that contains a graded-doping semiconductor material portion, and methods of manufacturing the same. Aspects of the present disclosure are now described in detail with accompanying figures. It is noted that like reference numerals refer to like elements across different embodiments. The drawings are not necessarily drawn to scale. As used herein, ordinals such as "first," "second," and "third" are employed merely to distinguish similar elements, and different ordinals may be employed to designate a same element in the specification and/or claims.

Referring FIG. 1, a first exemplary semiconductor structure according to an embodiment of the present disclosure includes a semiconductor substrate 8, which includes a single crystalline semiconductor material layer 10. The single crystalline semiconductor material can include, for example, an elemental semiconductor material such as silicon or germanium, an alloy of at least two elemental semiconductor materials such as a silicon-germanium alloy or a silicon-carbon alloy, a compound semiconductor material such as a III-V compound semiconductor material or a II-VI compound semiconductor material, an organic semiconductor material, or a stack thereof. In one embodiment, the single crystalline semiconductor material can be silicon. The semiconductor material of the single crystalline semiconductor material layer 10, disregarding the dopants therein, is herein referred to as a first semiconductor material.

The single crystalline semiconductor material can be intrinsic, or can be doped with at least one electrical dopant. As used herein, an "electrical dopant" refers to a p-type dopant or an n-type dopant. Exemplary p-type dopants include B, Ga, and In, and exemplary n-type dopants include P, As, and Sb. The conductivity type of the at least one electrical dopant is herein referred to as a first conductivity type, which can be p-type or n-type. If the single crystalline semiconductor material of the single crystalline semiconductor material layer 10 is doped with at least one electrical dopant, the concentration of the at least one electrical dopant in the single crystalline semiconductor material layer 10 can be from $1.0 \times 10^{14}/cm^3$ to $1.0 \times 10^{19}/cm^3$, although lesser and greater concentrations can also be employed. The substrate 8 can be a bulk substrate consisting of the single crystalline semiconductor material layer 10, or can be a semiconductor-on-insulator (SOI) substrate including a stack, from top to bottom, of the single crystalline semiconductor material layer 10, a buried insulator layer (not shown), and a handle substrate (not shown), or can be a hybrid substrate including a bulk portion and a semiconductor-on-insulator portion.

Shallow trench isolation structures (not shown) can be formed in uppermost portions of the single crystalline semiconductor material layer 10 employing methods known in the art, e.g., by forming trenches extending from the top surface of the single crystalline semiconductor material layer 10, filling the trenches with a dielectric material, and removing excess dielectric material from above the top surface of the single crystalline semiconductor material layer 10.

A gate dielectric layer 50L, a gate conductor layer 52L, and a gate cap dielectric layer 56L are sequentially deposited, for example, by various chemical vapor deposition processes. The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, and preferably from 1.0 nm to 3 nm, although lesser and greater thicknesses can also be employed.

The gate conductor layer 52L includes a conductive material, which can be a doped semiconductor material, a metallic material, or a combination thereof. The doped semiconductor material, if employed, can be doped polysilicon, doped polycrystalline germanium, a doped silicon-germanium alloy, any other doped elemental or compound semiconductor material, or a combination thereof. The metallic material, if employed, can be selected to optimize the performance of a transistor to be subsequently formed. Metallic materials that can be included in the gate conductor layer 52L include, but are not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, alloys thereof, conductive oxides thereof, conductive nitrides thereof, and any combinations of the foregoing. The gate conductor layer 52L can be deposited, for example, by chemical vapor deposition (CVD) and/or physical vapor deposition and/or any other deposition methods available in the art. The thickness of the gate conductive layer 52L can be from 20 nm to 300 nm, although lesser and greater thicknesses can also be employed.

The gate cap dielectric layer 56L includes a dielectric material such as silicon nitride, silicon oxide, organosilicate glass (OSG), a high dielectric constant (high-k) material layer that can be employed for the gate dielectric layer 50L, or a combination thereof. The gate cap dielectric layer 56L can be deposited, for example, by chemical vapor deposition or by any other deposition method known in the art. The thickness of the gate cap dielectric layer 56L can be from 10 nm to 200 nm, and typically from 20 nm to 100 nm, although lesser and greater thicknesses can also be employed.

Figure 2:
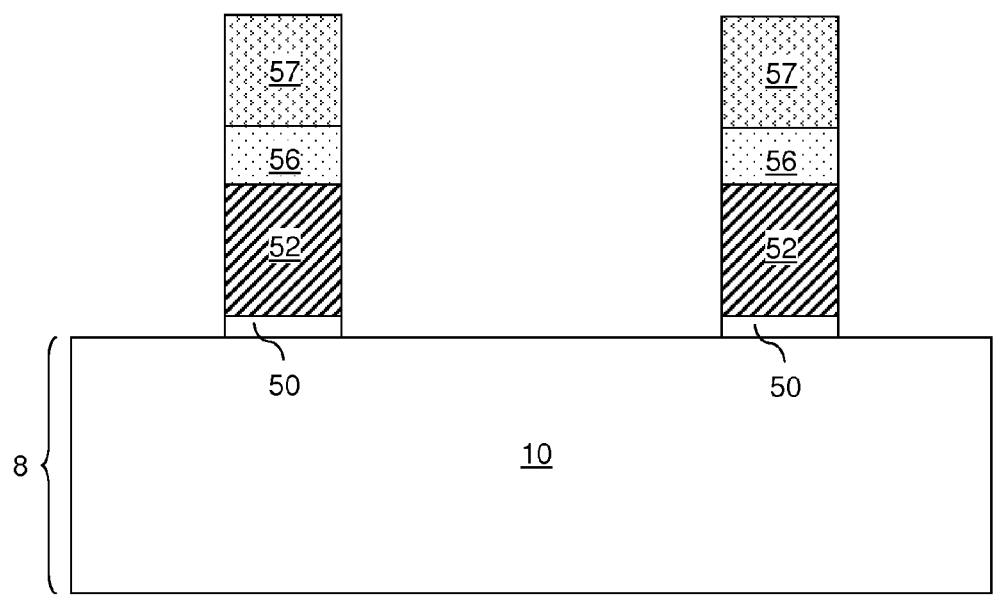
FIG. 2 is a vertical cross-sectional view of the first exemplary semiconductor structure after formation of gate stacks according to an embodiment of the present disclosure.

Referring to FIG. 2, a photoresist 57 is applied over the gate cap dielectric layer 56L, and is lithographically patterned by lithographic exposure and development. The pattern in the photoresist is transferred into the stack of the gate cap dielectric layer 56L, the gate conductor layer 52L, and the gate dielectric layer 50L to form gate stacks.

Each gate stack includes, from bottom to top, a gate dielectric 50, a gate conductor 52, and a gate cap dielectric 56. Each gate cap dielectric 56 is a remaining portion of the gate cap dielectric layer 56L. Each gate conductor 52 is a remaining portion of the gate conductor layer 52L. Each gate dielectric 50 is a remaining portion of the gate dielectric layer 50L. The sidewalls of the gate stacks (50, 52, 56) are vertically coincident with the sidewalls of the patterned photoresist 57, i.e., are coincident with the sidewalls of the patterned photoresist 57 when viewed in a vertical direction. Each gate stack (50, 52, 56) contacts a top surface of the single crystalline semiconductor material layer 10. The photoresist 57 is subsequently removed, for example, by ashing.

Figure 3:
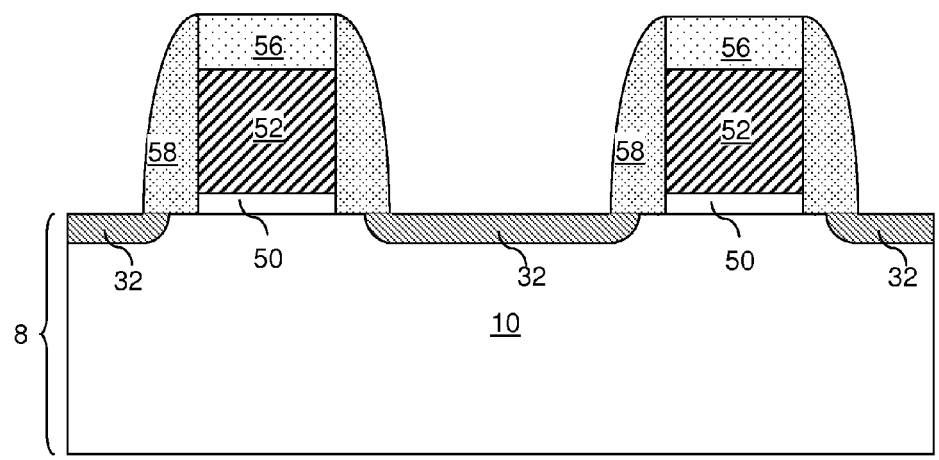
FIG. 3 is a vertical cross-sectional view of the first exemplary semiconductor structure after formation of single crystalline source/drain extension regions according to an embodiment of the present disclosure.

Referring to FIG. 3, gate spacers 58 are formed on sidewalls of the gate stacks (50, 52, 54, 56) by conformal deposition of a dielectric material layer and an anisotropic etch of horizontal portions of the dielectric material layer. The dielectric material of the gate spacers 58 can be silicon oxide, silicon nitride, or a combination thereof. The remaining vertical portions of the dielectric material layer constitute the gate spacers 58. Each gate spacer 58 laterally surrounds a gate stack (50, 52, 56). Each gate spacer 58 around a gate stack (50, 52, 56) is of unitary construction, i.e., contiguous throughout, and can be topologically homeomorphic to a torus. The lateral width of a gate spacer 58, as measured at the base of a gate spacer 58 between an outer sidewall of a gate stack (50, 52, 56) that the gate spacer 58 contacts and an adjacent outer sidewall of the gate spacer 58, can be from 2 nm to 150 nm, and typically from 10 nm to 100 nm, although lesser and greater widths can also be employed. Further, multiple gate spacers (not shown) can be formed and additional ion implantations can be formed to provide graded dopant concentration in the source/drain extension regions 32 and/or to provide multiple bottom surfaces (not shown) having different depths for the source/drain extension regions 32.

Electrical dopants are implanted into upper portions of the single crystalline semiconductor material layer 10. The conductivity type of the implanted electrical dopants is herein referred to as a second conductivity type. If the single crystalline semiconductor material layer 10 is doped with dopants of the first conductivity type, the second conductivity type can be the opposite type of the first conductivity type. For example, the first conductivity type can be p-type and the second conductivity type can be n-type, or vice versa. The gate stacks (50, 52, 56) are employed as an implantation mask so that regions of the single crystalline semiconductor material layer 10 that are covered by the gate stacks (50, 52, 56) are not implanted, but regions that are not covered by the gate stacks are implanted with the n-type dopants. Optionally, germanium, xenon, or carbon may also be implanted.

Implanted portions of the single crystalline semiconductor material layer 10 are converted into source/drain extension regions 32 having a doping of the second conductivity type. As used herein, "source/drain extension regions" collectively refer to at least one doped source extension region and at least one doped drain extension region. The concentration of the implanted electrical dopants in the source/drain extension regions 32 can be from $1.0 \times 10^{17}/cm^3$ to $1.0 \times 10^{21}/cm^3$, although lesser and greater concentrations can also be employed. The depth of the bottom of the source/drain extension regions 32, as measured from the topmost surface of the substrate 8, can be from 5 nm to 200 nm, and typically from 10 nm to 100 nm, although lesser and greater depths can also be employed. The source/drain extension regions 32 are single crystalline. Optionally, additional ion implantations may be performed. For example, halo ion implantations can be performed, in which first type dopants are implanted at an angle so that a thin layer of highly doped halo regions are formed on the outer edge of the source/drain extension regions 32 underneath the gate stacks (50, 52, 56) as known in the art. The single crystalline semiconductor material layer and the source/drain extension regions 32 include the first semiconductor material.

Figure 4:
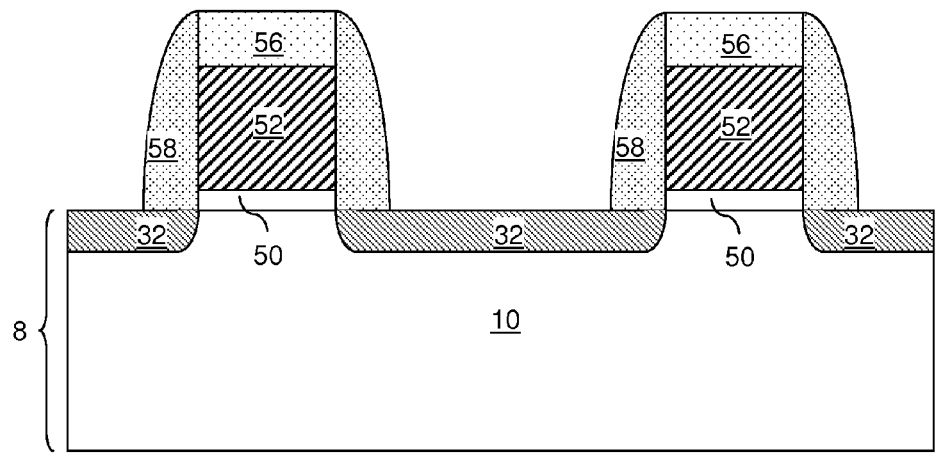
FIG. 4 is a vertical cross-sectional view of the first exemplary semiconductor structure after formation of gate spacers according to an embodiment of the present disclosure.

Referring to FIG. 4, an activation anneal may be performed to active the dopants in the source/drain extension regions 32. The source/drain extension regions 32 may expand laterally and vertically so that lateral edges of the source/drain extension regions approach peripheries of gate stacks (50, 52, 56).

Figure 5:
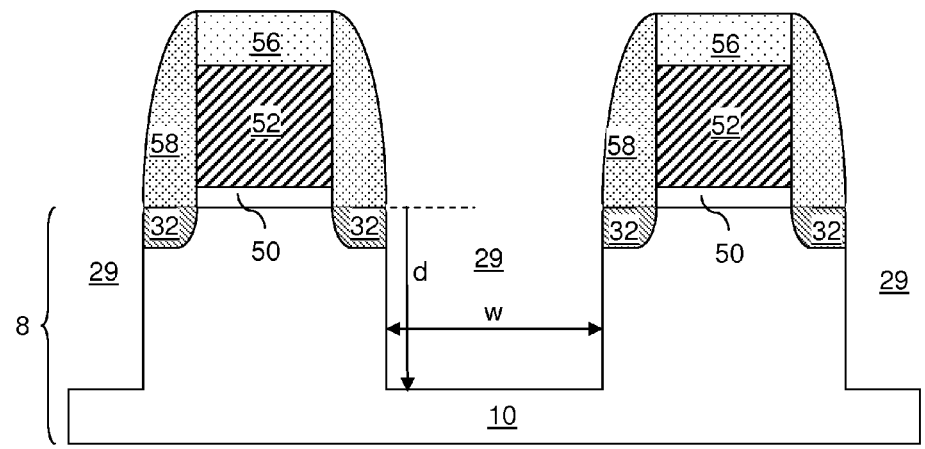
FIG. 5 is a vertical cross-sectional view of the first exemplary semiconductor structure after formation of trenches within a single crystalline semiconductor material layer according to an embodiment of the present disclosure.

Referring to FIG. 5, trenches 29 are formed within the single crystalline semiconductor material layer 10 by an etch, which employs the gate stacks (50, 52, 56) and the first and gate spacers 58 as an etch mask. The exposed portions of the single crystalline semiconductor material layer 10, i.e., the portions of the single crystalline semiconductor material layer 10 that are not covered by the gate stacks (50, 52, 56) and the first and gate spacers 58, are removed by the etch. In other words, the trenches 29 are formed by etching exposed portions of the semiconductor substrate 8 employing the gate stacks (50, 52, 56) and the gate spacers 58 as an etch mask. The etch can be an anisotropic etch that forms substantially vertical sidewalls within each trench 29.

During a first stage of the etching of the trenches 29, exposed portions of the source/drain extension region 32 are etched between adjacent pairs of gate spacers 58. An source/drain extension region 32 that extends from underneath a peripheral portion of a gate stack (50, 52, 56) to underneath a peripheral portion of another gate stack (50, 52, 56) are divided into two smaller source/drain extension regions 32 that are not contiguously connected to each other. Each of the two divided source/drain extension regions 32 underlies a peripheral portion of only one gate stack (50, 52, 56) after formation of the trenches 29 that extend to the depth of the bottom surfaces of the source/drain extension regions 32. At the end of the first stage, the trenches 29 occupy the space of the etched portions of the source/drain extension regions 32.

During a second stage of the etching of the trenches 29, i.e., once the exposed portions of the source/drain extension region 32 are etched through, portions of the single crystalline semiconductor material layer 10 underlying the trenches 29 hithertofore formed are further etched. Thus, the trenches 29 continue to be recessed downward during the second stage of the etching of the trenches 29 to a depth d from the topmost surface of the single crystalline semiconductor material layer 10, which is located at the interface between the single crystalline semiconductor material layer 10 and the gate dielectrics 50. The bottom surfaces of the trenches 29 are formed below the bottom surface of the source/drain extension regions 32. The vertical sidewalls of each trench 29 extend downward from the top surface of the semiconductor substrate 8. As used herein, a "vertical sidewall" is a sidewall that is vertical or deviates from a vertical plane by no more than 3 degrees in angle. The depth d can be from 10 nm to 400 nm, and typically from 20 nm to 200 nm, although lesser and greater depths can also be employed.

The sidewalls of the trenches 29 can be vertically coincident with the bottom portion of the sidewalls of the gate spacers 58 because the outer edges of the bottom portions of the gate spacers 58 define the locations of the sidewalls of the trenches 29. As used herein, a first surface and a second surface are "vertically coincident" with each other if there exists a vertical plane from the first surface and the second surface do not deviate by more than the sum of the surface roughness of the first surface and the surface roughness of the second surface. The width w of each trench 29 depends on the layout of the transistors to be formed, and can range from 20 nm to 2,000 nm, and typically from 40 nm to 1,000 nm, although lesser and greater widths can also be employed.

Figure 6:
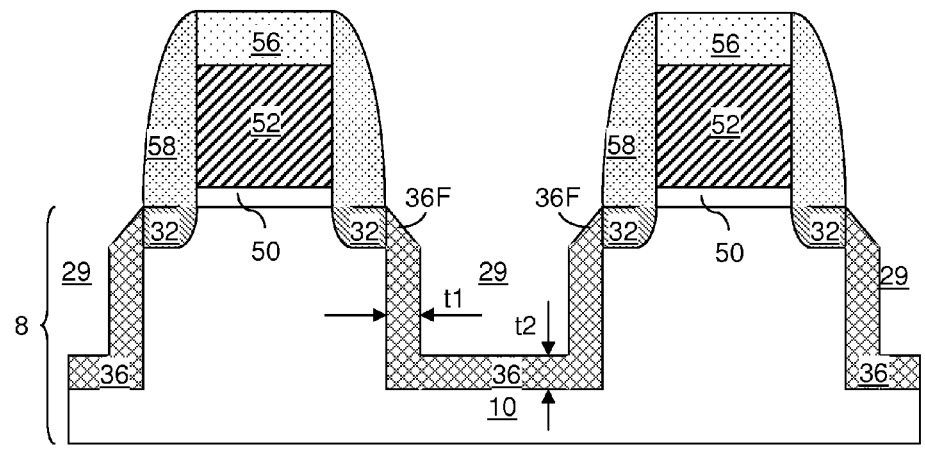
FIG. 6 is a vertical cross-sectional view of the first exemplary semiconductor structure after formation of stress-generating semiconductor material portions by a first selective epitaxy process according to an embodiment of the present disclosure.

Referring to FIG. 6, stress-generating semiconductor material portions 36 are formed on all exposed surfaces of semiconductor materials by a first selective epitaxy process. The stress-generating semiconductor material portions 36 include a single crystalline semiconductor material that is lattice-mismatched with respect to the single crystalline semiconductor material of the single cryystalline semiconductor material layer 10. The stress-generating semiconductor material portions 36 can include an intrinsic semiconductor material or a lightly-doped semiconductor material. As used herein, an "intrinsic" semiconductor material refers to a semiconductor material in which a total concentration of any electrical dopant therein is less than 0.1 parts per million (p.p.m.) in atomic concentration. As used herein, a "lightly-doped semiconductor material" refers to a semiconductor material having at least one electrical dopant at an atomic concentration not less than 0.1 parts per million (p.p.m.) and less than $1.0 \times 10^{20}/cm^3$.

A lattice mismatch refers to the state of lattice constants of two single crystalline semiconductor materials being different from each other. The percentage of lattice mismatch, which is the ratio of the difference in the lattice constants of two semiconductor materials to the average of the lattice constants of the two semiconductor materials, between the stress-generating semiconductor material portions 36 and the single crystalline semiconductor material layer 10 can be in a range from 0% to 10%, and typically in a range from 0.1% to 3%. The lattice mismatch can provide stress to the channel regions of the single crystalline semiconductor material layer 10 that underlie the gate stacks (50, 52, 56). If the lattice constant of the semiconductor material of the stress-generating semiconductor material portions 36 is greater than the lattice constant of the single crystalline semiconductor material layer 10, a compressive stress can be applied to the channel regions. If the lattice constant of the semiconductor material of the stress-generating semiconductor material portions 36 is less than the lattice constant of the single crystalline semiconductor material layer 10, a tensile stress can be applied to the channel regions.

The stress-generating semiconductor material is selectively deposited in the first selective epitaxy process. Specifically, the stress-generating semiconductor material portions 36 are deposited on sidewalls and the bottom surfaces of the trenches 29 during the first selective epitaxy process. To perform the first selective epitaxy process, the first exemplary semiconductor structure, which includes the substrate 8, the trenches 29 located therein, and the gate stacks (50, 52, 56) and the spacers 58 located upon the substrate 8, is placed in a reaction chamber. The semiconductor material of the stress-generating semiconductor material portions 36 is herein referred to as a second semiconductor material.

The reaction chamber can be a reduced pressure epitaxy chamber operating at a sub-atmospheric pressure or an atmospheric pressure epitaxy chamber operating at the atmospheric pressure. If a reduced pressure epitaxy chamber is employed, the operating pressure of the reduced pressure epitaxy chamber can be from 0.1 Torr to 600 Torr, and typically from 1 Torr to 100 Torr, although lesser and greater pressures can also be employed. Alternately, the reaction chamber can be a low pressure chemical vapor deposition chamber or an ultra-high vacuum chemical vapor deposition chamber. In this case, the reaction chamber can have a base pressure from $1.0 \times 10^{-10}$ Torr to $1.0 \times 10^{-3}$ Torr, and operate at a pressure range from $1.0 \times 10^{-3}$ Torr to $1.0 \times 10^{-1}$ Torr during the first selective epitaxy process.

The first epitaxy process is performed at an elevated temperature so that a semiconductor precursor gas is decomposed and deposited on surfaces of the exemplary semiconductor structure. The optimal deposition temperature for the first selective epitaxy process depends on the species of the semiconductor precursor gas and the process pressure, and is typically from 500° C. to 1,100° C., and typically from 600° C. to 1,000° C., although lesser and greater deposition temperatures can also be employed.

In one embodiment, the stress-generating semiconductor material portions 36 are deposited by simultaneously flowing into the reaction chamber a combination of at least one reactant gas (semiconductor precursor gas) and an etchant gas. The step in which the deposition process and the etch process proceed concurrently is herein referred to as a "selective deposition step." The etch gas is introduced simultaneously with the at least one reactant gas primarily to etch any polycrystalline or amorphous deposition occurring on the exposed dielectric surfaces, e.g., silicon nitride, silicon oxide etc., to preserve the selectivity of the process between semiconductor surfaces and dielectric surfaces.

The combination of gases employed in the first selective epitaxy process includes a semiconductor precursor gas and an etchant gas, and does not include any dopant gas, i.e., a gas that includes atoms of electrical dopants. In one embodiment, the semiconductor precursor gas can include a silicon precursor gas such as silane ($SiH_4$), dichlorosilane ($SiH_2Cl_2$), trichlorosilane ($SiHCl_3$), silicon tetrachloride ($SiCl_4$), and disilane ($Si_2H_6$); a germanium precursor gas such as $GeH_4$ and $Ge_2H_6$, a carbon precursor gas such as $CH_4$, $C_2H_2$, $C_2H_4$, $C_2H_6$, $C_3H_6$, and $C_3H_8$; or combinations thereof. In this case, the stress-generating semiconductor material portions 36 can include an intrinsic elemental semiconductor material or an alloy of at least two elemental semiconductor materials. In another embodiment, the semiconductor precursor gas can include a combination of precursor gases for forming a compound semiconductor material or an organic semiconductor material. Optionally, if a lightly-doped semiconductor material is deposited during the first selective epitaxy process, a dopant gas may also be flowed into the process chamber.

Optionally, a carrier gas can be included in the combination of gases. The carrier gas can be, for example, $H_2$, $N_2$, He, Ar, or a combination thereof. If employed, the ratio of the flow rate of the carrier gas to the flow rate of the semiconductor precursor gas can be from 1,000 to 1, and typically from 200 to 5, although lesser and greater ratios can also be employed. The flow rates of the semiconductor precursor gas, the n-type dopant gas, and the carrier gas (if employed), depends on the size, the operating pressure of the reaction chamber, and the desired deposition rate during the first selective epitaxy process.

The etchant is a gas that etches silicon at the elevated temperature, i.e., the deposition temperature of the first selective epitaxy process. The etchant can be, for example, HCl. The etchant can be flowed simultaneously with the combination of gases, or can be flowed alternately with the combination of gases. Optionally, a carrier gas such as $H_2$ or $N_2$ can be flowed with the etchant.

The semiconductor precursor gas is selected so that the stress-generating semiconductor material portions 36 includes a single crystalline semiconductor material that is epitaxially aligned to, and lattice mismatched relative to, the semiconductor material of the single crystalline semiconductor material layer 10. In other words, the first semiconductor material of the single crystalline semiconductor material layer 10 and the second semiconductor material of the stress-generating semiconductor material portions 36 can be different even after disregarding the differences in electrical dopant concentration.

In one embodiment, the semiconductor material of the single crystalline semiconductor material layer 10, i.e., the first semiconductor material, can be silicon, and the semiconductor material of the stress-generating semiconductor material portions 36, i.e., the second semiconductor material, can be a silicon-germanium alloy. The atomic concentration of germanium in the silicon-germanium alloy can be in a range from 0.1% to 60%. In this case, a compressive stress is applied to the channel regions of the single crystalline semiconductor material layer 10. In one embodiment, the semiconductor material of the single crystalline semiconductor material layer 10 can be n-doped single crystalline silicon, and the semiconductor material of the stress-generating semiconductor material portions 36 can be an intrinsic single crystalline silicon-germanium alloy.

In another embodiment, the semiconductor material of the single crystalline semiconductor material layer 10, i.e., the first semiconductor material, can be silicon, and the semiconductor material of the stress-generating semiconductor material portions 36, i.e., the second semiconductor material, can be a silicon-carbon alloy. The atomic concentration of germanium in the silicon-carbon alloy can be in a range from 0.01% to 2%. In this case, a tensile stress is applied to the channel regions of the single crystalline semiconductor material layer 10. In one embodiment, the semiconductor material of the single crystalline semiconductor material layer 10 can be p-doped single crystalline silicon, and the semiconductor material of the stress-generating semiconductor material portions 36 can be an intrinsic single crystalline silicon-carbon alloy.

When the combination of the at least one semiconductor precursor gas and the etchant gas is simultaneously flowed into the reaction chamber, a stress-generating semiconductor material is deposited on exposed semiconductor surfaces while the combination of gases flows into the reaction chamber. The stress-generating semiconductor material is deposited immediately, i.e., without any time delay after the turn-on of the combination of the gases, on physically exposed semiconductor surfaces, which are the sidewalls and the bottom surfaces of the trenches 29. By selecting a deposition temperature that provides sufficient surface diffusion of adatoms on single crystalline surfaces of the sidewalls and bottom surfaces of the trenches 29, the deposited stress-generating semiconductor material is added to the surfaces of the sidewalls and bottom surfaces of the trenches 29. As for the dielectric surfaces such as the surfaces of the gate cap dielectrics 56 and the gate spacers 58, the stress-generating semiconductor material must nucleate on the dielectric surfaces before deposition can proceed at any significant rate. The finite time interval between the beginning of the flow of the semiconductor precursor gas and significant nucleation of intrinsic semiconductor on dielectric material is referred to as a "nucleation time" or an "incubation time." The nucleation time is typically from 1 second to 30 seconds, although lesser and greater nucleation times are possible depending on the process parameters of the deposition step. In addition, the growth of a single crystalline semiconductor material, which occurs on single crystalline surfaces, is generally faster than the growth of a polycrystalline material, which occurs on dielectric surfaces, by a factor of about 2 under most deposition conditions. Thus, the thickness of the single crystalline semiconductor material that accumulates on sidewalls and bottom surfaces of the trenches 29 is greater than the thickness of any semiconductor material that may nucleate on the dielectric surfaces of the gate cap dielectrics 56 and the gate spacers 58 even when the effect of the etchant is not considered.

Because of the presence of the etchant gas during the selective epitaxy process, the etchant removes all of the non-crystalline material that may nucleate and grow on the dielectric surfaces of the gate cap dielectric 56 and the gate spacers 58. The process time for the selective epitaxy process is selected such that the stress-generating semiconductor material portions 36 are deposited only on the sidewalls and bottom surfaces of the trench 29. In other words, the etch conditions including etchant flow, process temperature, etc., are sufficient to remove all non-crystalline semiconductor material from the dielectric surfaces.

Each stress-generating semiconductor material portion 36 is formed with at least one faceted surface 36F. Each faceted surface 36F of the stress-generating semiconductor material portion 36 is a crystallographic facet of a single crystalline semiconductor material, and is non-horizontal and non-vertical. In other words, the angle between the plane including a faceted surface 36F of each stress-generating semiconductor material portion 36 and a vertical line is greater than 0 degree and is less than 90 degrees.

In one embodiment, each faceted surface 36F of the stress-generating semiconductor material portions 36 is a crystallographic facet is a low Miller index crystallographic plane. As used herein, a "low Miller index crystallographic plane" refers to a plane having a Miller index for which the sum of the absolute values of the three numbers representing the Miller index is less than 7. In one embodiment, the vertical sidewalls of the trenches 29 can have any orientation other than one of the orientations of the {111} plane, and the low Miller index crystallographic plane can be a {111} plane. For example, the vertical sidewalls of the trenches 29 can be along a {100} orientation or a {110} orientation, and the low Miller index crystallographic planes of the faceted surfaces 36F of the stress-generating semiconductor material portions 36 can be a {111} plane. Alternately, the vertical sidewalls of the trenches 29 can be a vicinal surface that is not a low Miller index crystallographic plane, and the low Miller index crystallographic planes of the faceted surfaces 36F of the stress-generating semiconductor material portions 36 can be a {111} plane.

Formation of the faceted surfaces 36F of the stress-generating semiconductor material portions 36 can occur because the growth rate of the stress-generating semiconductor material during the first selective epitaxy process depends on the orientation of the semiconductor surfaces. The faceted surfaces 36F include crystallographic planes on which the net deposition rate of the stress-generating semiconductor material can become substantially zero. Because the deposition rate of the stress-generating semiconductor material on other crystallographic surfaces can be positive, the faceted surfaces 36F of the stress-generating semiconductor material portions 36 can be maintained throughout the first selective epitaxy process.

Each faceted surface 36F of the stress-generating semiconductor material portions 36 is adjoined to a vertical sidewall of a trench 29. As used herein, a first surface is adjoined to a second surface if there exists an edge that is shared by a periphery of the first surface and a periphery of the second surface. Specifically, each faceted surface 36F of the stress-generating semiconductor material portions 36 is adjoined to a top edge of a vertical sidewall of a trench 29 (within which the stress-generating semiconductor material portion 36 is present at this processing step). Further, a horizontal interface between a source/drain extension region 32 and a gate spacer 58, which is a topmost surface of a contiguous semiconductor material portion including the single crystalline semiconductor material layer and the source/drain extension regions 32, adjoins a top edge of each vertical sidewall of a trench 29. Yet further, an outer sidewall of a gate spacer 58 adjoins the edge at which a faceted top surface of an stress-generating semiconductor material portion 36, a vertical sidewall of a trench 29, and a horizontal interface between a source/drain extension region 32 and a gate spacer 58. Thus, the outer sidewall of the gate spacer 58, the faceted top surface of an stress-generating semiconductor material portion 36, the vertical sidewall of a trench 29, and the horizontal interface between the source/drain extension region 32 and the gate spacer 58 coincide at the edge as a common periphery. Further, the vertical sidewall of each trench 29 is vertically coincident with a lower potion of an outer sidewall of a gate spacer 58.

In one embodiment, the faceted surfaces 36F of the intrinsic semiconductor material portion 36 not adjoin the topmost edge of the vertical sidewalls of the trenches 29, but may be recessed relative to the topmost edge of the vertical sidewalls of the trenches 29 by a finite distance. In one embodiment, the finite distance may be in a range from 0 nm to 10 nm. In one embodiment, the finite distance may be in a range from 0 nm to 3 nm.

Each stress-generating semiconductor material portion 36 includes at least one tapered region including a faceted surface 36F (i.e., a crystallographic facet), a uniform-width vertical portion having a first uniform width t1 that is invariant under translation along a vertical direction, and a uniform-width horizontal portion t2 having a second uniform width that is invariant under translation along a horizontal direction. The first uniform width t1 can be in a range from 2 nm to 20 nm. In one embodiment, the first uniform width t1 can be in a range from 4 nm to 8 nm. The second uniform width t2 can be in a range from 2 nm to 20 nm. In one embodiment, the second uniform width t2 can be in a range from 4 nm to 8 nm.

The first selective epitaxy process can be performed in a single processing step. During the first selective epitaxy process, a deposition process and an etch process occur simultaneously. The partial pressure of the semiconductor precursor gas and the partial pressure of the etchant gas are controlled such that a crystallographic facet of each stress-generating semiconductor material portion 36 adjoins a common edge of three surfaces including a vertical sidewall of a trench 29, an interface between the gate spacers 58 and the source/drain extension region 32, and an outer sidewall of the gate spacer 58 until the completion of the first selective epitaxy process. In other words, the partial pressure of the semiconductor precursor gas and the partial pressure of the etchant are selected to maintain the facets of the stress-generating semiconductor material portions 36. In one embodiment, the partial pressure of the semiconductor precursor gas can be in a range from 0.1 Torr to 10 Torr, and the partial pressure of the etchant can be in a range from 1 Torr to 50 Torr. The temperature of the first selective epitaxy process can also be adjusted to maintain the faceted surfaces 36F of the stress-generating semiconductor material portions 36 throughout the first selective epitaxy process. In one embodiment, the temperature of the first selective epitaxy process can be in a range from 600° C. to 900° C. and optimized to provide faceted surfaces 36F during the first selective epitaxy process.

Figure 8:
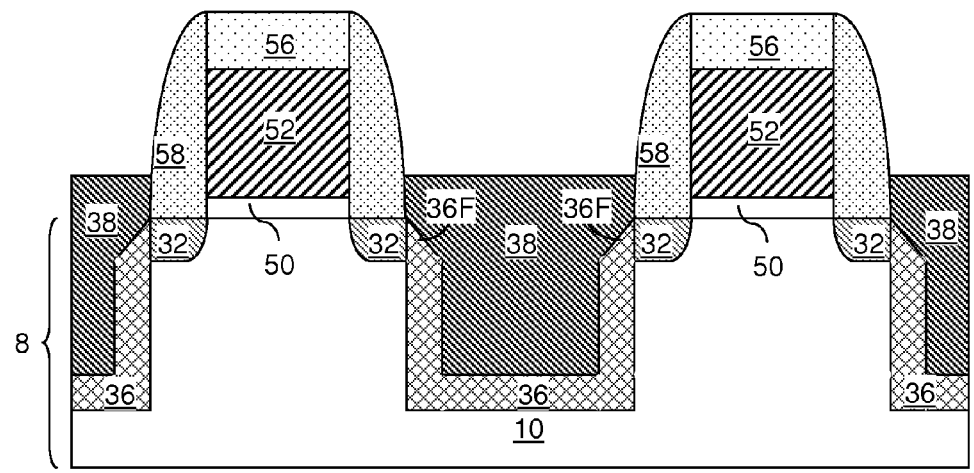
FIG. 8 is a vertical cross-sectional view of the first exemplary semiconductor structure after formation of doped semiconductor material portions by a second selective epitaxy process according to an embodiment of the present disclosure.

Referring to FIG. 8, doped semiconductor material portions 38 are formed on all exposed surfaces of the stress-generating semiconductor material portions 36 by a second selective epitaxy process. The second selective epitaxy process deposits a doped single crystalline semiconductor material by in-situ doping, and is herein referred to as an in-situ doped selective epitaxy process. The atomic concentration of the electrical dopants in the doped semiconductor material portions 38 is greater than the atomic concentration of the electrical dopants in the stress-generating semiconductor material portions 36. In one embodiment, the stress-generating semiconductor material portions 36 are intrinsic single crystalline semiconductor material portions. In another embodiment, the stress-generating semiconductor material portions 36 are lightly-doped single crystalline semiconductor material portions, and the atomic concentration of the electrical dopants in the doped semiconductor material portions 38 is greater than the atomic concentration of the electrical dopants in the stress-generating semiconductor material portions 36. In one embodiment, the atomic concentration of the electrical dopants in the doped semiconductor material portions 38 can be in a range from $1.0 \times 10^{20}/cm^3$ to $3.0 \times 10^{21}/cm^3$, although lesser and greater atomic concentrations can also be employed.

Specifically, the doped semiconductor material portions 38 grow from sidewalls and top surfaces of the stress-generating semiconductor material portion 36 during the second selective epitaxy process, but do not grow from the faceted surfaces 36F of the stress-generating semiconductor material portions 36. To perform the second selective epitaxy process, the first exemplary semiconductor structure, which includes the substrate 8, the stress-generating semiconductor material portions 36, and the gate stacks (50, 52, 56) and the spacers 58 located upon the substrate 8, is placed in a reaction chamber, which can be the same reaction chamber as, or a different reaction chamber than, the reaction chamber employed for the first selective epitaxy process.

The reaction chamber can be a reduced pressure epitaxy chamber operating at a sub-atmospheric pressure or an atmospheric pressure epitaxy chamber operating at the atmospheric pressure. If a reduced pressure epitaxy chamber is employed, the operating pressure of the reduced pressure epitaxy chamber can be from 0.1 Torr to 600 Torr, and typically from 1 Torr to 100 Torr, although lesser and greater pressures can also be employed. Alternately, the reaction chamber can be a low pressure chemical vapor deposition chamber or an ultra-high vacuum chemical vapor deposition chamber. In this case, the reaction chamber can have a base pressure from $1.0 \times 10^{-10}$ Torr to $1.0 \times 10^{-3}$ Torr, and operate at a pressure range from $1.0 \times 10^{-3}$ Torr to $1.0 \times 10^{-1}$ Torr during the first selective epitaxy process.

The second epitaxy process is performed at an elevated temperature so that a semiconductor precursor gas is decomposed and deposited on surfaces of the exemplary semiconductor structure. The optimal deposition temperature for the second selective epitaxy process depends on the species of the semiconductor precursor gas and the process pressure, and is typically from 500° C. to 1,100° C., and typically from 600° C. to 1,000° C., although lesser and greater deposition temperatures can also be employed.

In one embodiment, the doped semiconductor material portions 38 are deposited by simultaneously flowing into the reaction chamber a combination of at least one reactant gas (semiconductor precursor gas), a dopant gas, and an etchant gas. The etch gas is introduced simultaneously with the at least one reactant gas primarily to etch any polycrystalline or amorphous deposition occurring on the exposed dielectric surfaces, e.g., silicon nitride, silicon oxide etc., to preserve the selectivity of the process between semiconductor surfaces and dielectric surfaces. The semiconductor material of the doped semiconductor material portion 38 without regard to the dopant atoms therein is herein referred to as a third semiconductor material. The third semiconductor material may be the same as the second semiconductor material, or may differ from the second semiconductor material by compositional percentages. In one embodiment, the third semiconductor material in the doped semiconductor material portion 38 may generate the same type of stress in channel regions as the stress-generating semiconductor material portions 36. In one embodiment, both of the third semiconductor material in the doped semiconductor material portion 38 and the stress-generating semiconductor material portions 36 may generate a compressive stress in channel regions. In another embodiment, both of the third semiconductor material in the doped semiconductor material portion 38 and the stress-generating semiconductor material portions 36 may generate a tensile stress in the channel regions. For example, if the second semiconductor material is a silicon germanium alloy and the third semiconductor material is another silicon germanium alloy, the atomic concentration of germanium of the third semiconductor material may be the same as, or may be different from, the atomic concentration of germanium in the second semiconductor material. If the second semiconductor material is a silicon carbon alloy and the third semiconductor material is another silicon carbon alloy, the atomic concentration of carbon of the third semiconductor material may be the same as, or may be different from, the atomic concentration of carbon in the second semiconductor material.

The combination of gases employed in the second selective epitaxy process includes a semiconductor precursor gas, a dopant gas for an electrical dopant, and an etchant gas. In one embodiment, the semiconductor precursor gas can include a silicon precursor gas such as silane ($SiH_4$), dichlorosilane ($SiH_2Cl_2$), trichlorosilane ($SiHCl_3$), silicon tetrachloride ($SiCl_4$), and disilane ($Si_2H_6$); a germanium precursor gas such as $GeH_4$ and $Ge_2H_6$, a carbon precursor gas such as $CH_4$, $C_2H_2$, $C_2H_4$, $C_2H_6$, $C_3H_6$, and $C_3H_8$; or combinations thereof.

The dopant gas includes a compound, which may be a hydride, of an electrical dopant, i.e., a p-type dopant or an n-type dopant. If the source/drain extension regions 32 having a doping of the second conductivity type are present, the conductivity type of the electrical dopant is the second conductivity type. If the single crystalline semiconductor material layer 10 includes a doped semiconductor material having a doping of the first conductivity type, the conductivity type of the electrical dopant in the dopant gas is the opposite type of the first conductivity type, which is the second conductivity type. The dopant gas can include at least one of diborane ($B_2H_6$), phosphine ($PH_3$), arsine ($AsH_3$), or stybine ($SbH_3$). In this case, each doped semiconductor material portions 38 can include a doped elemental semiconductor material or a doped alloy of at least two elemental semiconductor materials. In another embodiment, the semiconductor precursor gas can include a combination of precursor gases for forming a compound semiconductor material or an organic semiconductor material.

Optionally, a carrier gas can be included in the combination of gases. The carrier gas can be, for example, $H_2$, $N_2$, He, Ar, or a combination thereof. If employed, the ratio of the flow rate of the carrier gas to the flow rate of the semiconductor precursor gas can be from 1,000 to 1, and typically from 200 to 5, although lesser and greater ratios can also be employed. The flow rates of the semiconductor precursor gas, the n-type dopant gas, and the carrier gas (if employed), depends on the size, the operating pressure of the reaction chamber, and the desired deposition rate during the first selective epitaxy process.

The etchant is a gas that etches silicon at the elevated temperature, i.e., the deposition temperature of the first selective epitaxy process. The etchant can be, for example, HCl. The etchant can be flowed simultaneously with the combination of gases, or can be flowed alternately with the combination of gases. Optionally, a carrier gas such as $H_2$ or $N_2$ can be flowed with the etchant.

The semiconductor precursor gas is selected so that the doped semiconductor material portions 38 includes a single crystalline semiconductor material that is epitaxially aligned to, and lattice mismatched relative to, the semiconductor material of the stress-generating semiconductor material portions 36, and to the semiconductor material of the single crystalline semiconductor material layer 10. The percentage of lattice mismatch between the doped semiconductor material portions 38 and the single crystalline semiconductor material layer 10 can be in a range from 0% to 10%, and typically in a range from 0.1% to 3%. The lattice mismatch can provide stress to the channel regions of the single crystalline semiconductor material layer 10 that underlie the gate stacks (50, 52, 56). If the lattice constant of the semiconductor material of the doped semiconductor material portions 38 is greater than the lattice constant of the single crystalline semiconductor material layer 10, a compressive stress can be applied to the channel regions. If the lattice constant of the semiconductor material of the doped semiconductor material portions 38 is less than the lattice constant of the single crystalline semiconductor material layer 10, a tensile stress can be applied to the channel regions.

The composition of the doped semiconductor material portions 38 excluding the dopants therein may be the same as, or different from, the composition of the stress-generating semiconductor material portion 36. In one embodiment, the composition of the doped semiconductor material portions 38 excluding the dopants therein may be the same as the composition of the stress-generating semiconductor material portion 36. In another embodiment, the composition of the doped semiconductor material portions 38 excluding the dopants therein may be different from the composition of the stress-generating semiconductor material portion 36.

In one embodiment, the semiconductor material of the single crystalline semiconductor material layer 10 can be silicon, and the semiconductor material of the doped semiconductor material portions 38 can be a silicon-germanium alloy. The atomic concentration of germanium in the silicon-germanium alloy can be in a range from 0.1% to 60%. In this case, a compressive stress is applied to the channel regions of the single crystalline semiconductor material layer 10. In one embodiment, the semiconductor material of the single crystalline semiconductor material layer 10 can be n-doped single crystalline silicon, and the semiconductor material of the doped semiconductor material portions 38 can be an intrinsic single crystalline silicon-germanium alloy.

In another embodiment, the semiconductor material of the single crystalline semiconductor material layer 10 can be silicon, and the semiconductor material of the doped semiconductor material portions 38 can be a silicon-carbon alloy. The atomic concentration of germanium in the silicon-carbon alloy can be in a range from 0.01% to 2%. In this case, a tensile stress is applied to the channel regions of the single crystalline semiconductor material layer 10. In one embodiment, the semiconductor material of the single crystalline semiconductor material layer 10 can be p-doped single crystalline silicon, and the semiconductor material of the doped semiconductor material portions 38 can be an intrinsic single crystalline silicon-carbon alloy.

When the combination of the at least one semiconductor precursor gas, the dopant gas, and the etchant gas is simultaneously flowed into the reaction chamber, an in-situ doped semiconductor material is deposited on exposed semiconductor surfaces while the combination of gases flows into the reaction chamber. The in-situ doped semiconductor material is deposited immediately, i.e., without any time delay after the turn-on of the combination of the gases, on physically exposed semiconductor surfaces, which are the sidewalls and top surfaces of the stress-generating semiconductor material portions 36. By selecting a deposition temperature that provides sufficient surface diffusion of adatoms on single crystalline surfaces of the sidewalls and top surfaces of the stress-generating semiconductor material portions 36, the deposited in-situ doped semiconductor material is added to the surfaces of the sidewalls and top surfaces of the stress-generating semiconductor material portion 36. The in-situ doped semiconductor material does not grow from any dielectric surface.

Each doped semiconductor material portion 38 is formed with at least one faceted surface 38F. Each faceted surface 38F of the doped semiconductor material portion 38 is a crystallographic facet of a single crystalline semiconductor material, and is non-horizontal and non-vertical. Each faceted surface 38F of the doped semiconductor material portion. In other words, the angle between the plane including a faceted surface 38F of each doped semiconductor material portion 38 and a vertical line is greater than 0 degree and is less than 90 degrees.

The in-situ doped selective epitaxy process can be performed in a single processing step. During the in-situ doped selective epitaxy process, a deposition process and an etch process occur simultaneously. The partial pressure of the semiconductor precursor gas and the partial pressure of the etchant gas are controlled such that the doped semiconductor material does not grow from the faceted surfaces 36F of the stress-generating semiconductor material portions 36. In this case, each doped semiconductor material portion 38 develops a crystallographic facet 38F that is coplanar with a crystallographic facet 36F of an stress-generating semiconductor material portion 36.

Formation of the faceted surfaces 38F of the doped semiconductor material portions 38 can occur because the growth rate of the in-situ doped semiconductor material during the second selective epitaxy process depends on the orientation of the semiconductor surfaces. The faceted surfaces 38F include crystallographic planes on which the net deposition rate of the in-situ doped semiconductor material can become substantially zero. Because the deposition rate of the in-situ doped semiconductor material on other crystallographic surfaces can be positive, the faceted surfaces 38F of the doped semiconductor material portions 38 can be maintained throughout the first selective epitaxy process.

In one embodiment, each faceted surface 38F of the doped semiconductor material portions 38 can be coplanar with, and have the same crystallographic surface orientation as, a faceted surface 36F of an stress-generating semiconductor material portion 36. In one embodiment, the vertical sidewalls of the stress-generating semiconductor material portions 36 can have any orientation other than one of the orientations of the $\{111\}$ plane, and faceted surface 38F of the doped semiconductor material portions 38 can have a low Miller index crystallographic plane. In one embodiment, the low Miller index crystallographic plane can be a $\{111\}$ plane. For example, the vertical sidewalls of the stress-generating semiconductor material portion 36 can be along a $\{100\}$ orientation or a $\{110\}$ orientation, and the low Miller index crystallographic planes of the faceted surfaces 38F of the doped semiconductor material portions 38 can be a $\{111\}$ plane. Alternately, the vertical sidewalls of the stress-generating semiconductor material portion 36 can be a vicinal surface that is not a low Miller index crystallographic plane, and the low Miller index crystallographic planes of the faceted surfaces 38F of the doped semiconductor material portions 38 can be a $\{111\}$ plane.

In general, at least one faceted surface 38F is formed on each doped semiconductor material portion 38 during a during a time period of the in-situ doped selective epitaxy process, which is herein referred to as a first time period of the in-situ doped selective epitaxy process. Each faceted surface 38F of a doped semiconductor material portion can be coplanar with a faceted surface 36F of an stress-generating semiconductor material portion 36 during the first time period of the in-situ doped selective epitaxy process. The inner sidewalls of each doped semiconductor material portion 38, which can be substantially vertical, can merge at the end of the first time period of the in-situ doped selective epitaxy process as the lateral distance between a pair of inner sidewalls of each doped semiconductor material portion 38 decreases to zero. The presence of the faceted surfaces 38F of the doped semiconductor material portions 38 has a beneficial effect of reducing the aspect ratio of a cavity between the pair of inner sidewalls of each doped semiconductor portion by reducing the height of the inner sidewalls, thereby enabling complete filling of the cavity without a void.

Referring to FIG. 8, the second selective epitaxy process, i.e., the in-situ doped selective epitaxy process, continues after the end of the first time period. The time period of the second selective epitaxy process that follows the first time period is herein referred to as a second time period.

Figure 7:
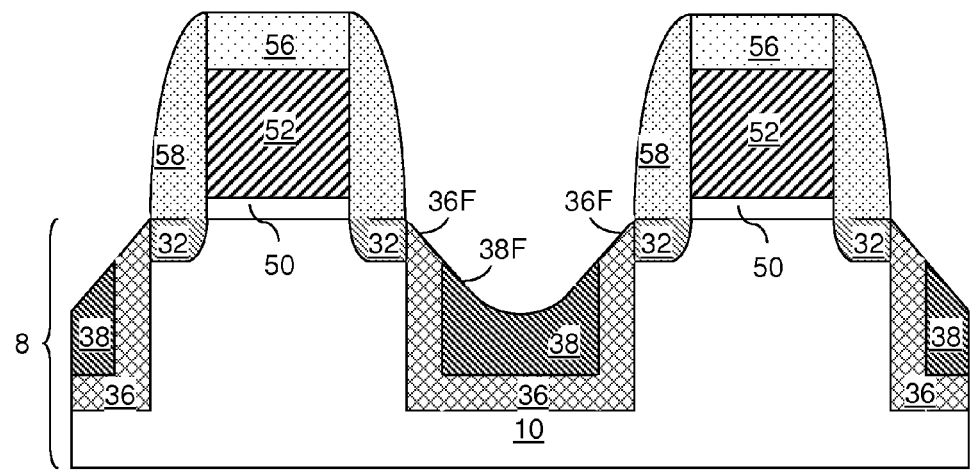
FIG. 7 is a vertical cross-sectional view of the first exemplary semiconductor structure during formation of doped semiconductor material portions by a second selective epitaxy process according to an embodiment of the present disclosure.

During the second time period of the in-situ doped selective epitaxy process, the doped semiconductor material grows from the faceted surfaces 36F (See FIG. 7) of the stress-generating semiconductor material portion 36 and the faceted surfaces 38F of the doped semiconductor material portions 38. Each trench 29 (See FIG. 5) can be completely filled with the stress-generating semiconductor material of the stress-generating semiconductor material portions 36 and the doped semiconductor material of the doped semiconductor material portions 38. After the second time period of the in-situ doped selective epitaxy process, two surfaces of a portion of the deposited doped semiconductor material, i.e., a surface of a doped semiconductor material portion 38 in contact with an outer sidewall of a gate spacer 58 and a surface of the doped semiconductor material portion 38 in contact with a faceted surface 36F of an stress-generating semiconductor material portion 36, are adjoined to each other at the edge at which the outer sidewall of the gate spacer 58, the faceted top surface of an stress-generating semiconductor material portion 36, the vertical sidewall of a trench 29, and the horizontal interface between the source/drain extension region 32 and the gate spacer 58 coincide.

During the second time period of the in-situ doped selective epitaxy process, the same combination of at least one reactant gas, a dopant gas, and an etchant gas can be employed as in the first time period of the in-situ doped selective epitaxy process. The growth of the doped semiconductor material from the faceted surfaces 36F (See FIG. 7) of the stress-generating semiconductor material portion 36 and the faceted surfaces 38F of the doped semiconductor material portions 38 can be enabled by adjusting at least one process parameter relative to the process parameters employed during the first time period of the in-situ doped selective epitaxy process such that the net deposition rate of the doped semiconductor material becomes less dependent on surface orientations of crystallographic facets. For example, the temperature of the doped selective epitaxy process may be increased, and/or the partial pressure of the at least one reactant gas and the partial pressure of the etchant gas may be increased during the second time period of the in-situ doped selective epitaxy process relative to the first time period of the in-situ doped selective epitaxy process in order to reduce the orientation dependency of the deposition rate.

Top surfaces of the doped semiconductor material portions 38 may be crystallographic or non-crystallographic. In one embodiment, the faceted surfaces 36F (See FIG. 7) of the stress-generating semiconductor material portion 36 and the faceted surfaces 38F of the doped semiconductor material portions 38 may be {111} crystallographic facets, and the top surfaces of the doped semiconductor material portions 38 during the second time period of the in-situ doped selective epitaxy process may include a {001} surface, which may be a horizontal surface.

Figure 9:
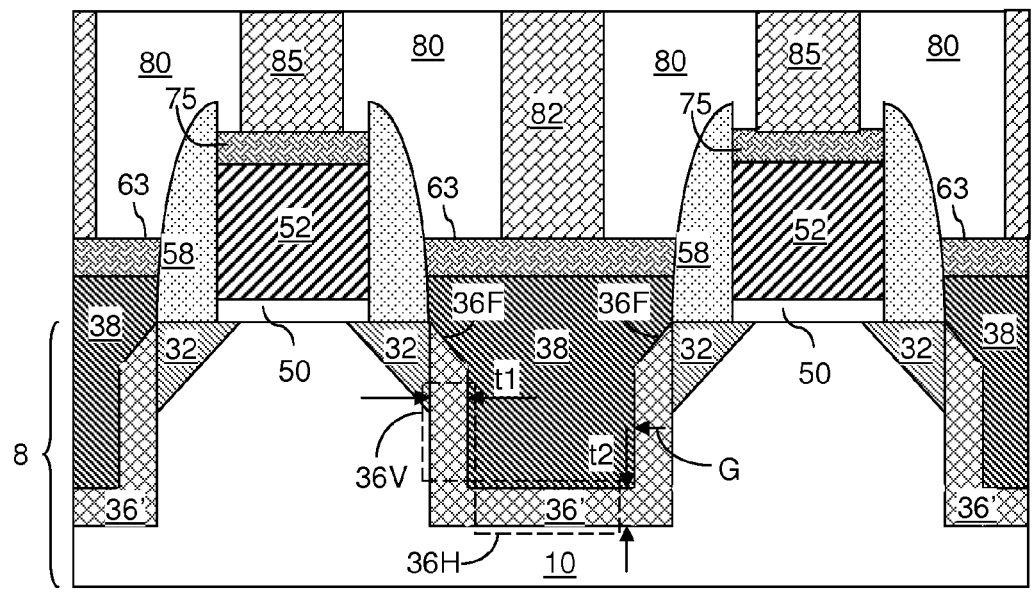
FIG. 9 is a vertical cross-sectional view of the first exemplary semiconductor structure after formation of a contact-level dielectric material layer and contact via structures according to an embodiment of the present disclosure.

Referring to FIG. 9, an anneal may be performed at an elevated temperature sufficiently high to diffuse the electrical dopants of the second conductivity type from the doped semiconductor material portions 38 into the stress-generating semiconductor material portions 36 and into the source/drain extension regions 32. The anneal temperature is selected to be low enough to avoid stress relaxation in the epitaxial material. Each of the stress-generating semiconductor material portions 36 is doped with dopants of the second conductivity type that diffuse out of the doped semiconductor material portions 38, and is converted into a graded-doping semiconductor material portion 36'. As used herein, a "graded-doping" refers to a dopant concentration profile in which the concentration of the dopant has a gradient, i.e., increases along a direction (that may vary locally). Each graded-doping semiconductor material portion 36' is located in a trench within semiconductor material portions including the first semiconductor material, i.e., the combination of the single crystalline semiconductor material layer 10 and the source/drain extension regions 32. Each graded-doping semiconductor material portion 36' is epitaxially aligned to the single crystalline semiconductor material layer 10, including a faceted surface that adjoins a topmost portion of a vertical sidewall of the trench at an edge, and has a gradient in the dopant concentration of the electrical dopants. A doped semiconductor material portion 38 is embedded in each graded-doping semiconductor material portion 36', and protrudes above the trench. Each doped semiconductor material portion 38 is epitaxially aligned to a graded-doping semiconductor material portion 36', and is spaced from the single crystalline semiconductor material layer 10 by the graded-doping semiconductor material portion 36'.

Each graded-doping semiconductor material portion 36' includes a tapered region including the faceted surface 36', a uniform-width vertical portion 36V having the first uniform width t1 that is invariant under translation along a vertical direction, and a uniform-width horizontal portion 36H having a second uniform width t2 that is invariant under translation along a horizontal direction. A doped semiconductor material portion 38 contacts each faceted surface 36F of a graded-doping semiconductor material portion 36', at least two vertical sidewalls of the graded-doping semiconductor material portion 36', and a horizontal surface of the graded-doping semiconductor material portion 36'. In one embodiment, the gradient in the dopant concentration points toward an interface between the graded-doping semiconductor material portion 36' and the doped semiconductor material portion 38 within each graded-doping semiconductor material portion 36'.

In one embodiment, vertical portions of each graded-doping semiconductor material portion 36' can have a uniform thickness, i.e., the first uniform width t1, the diffusion of electrical dopants occurs uniformly except in regions neighboring a faceted region of the graded-doping semiconductor material portion 36'. In another embodiment, vertical portions of each graded-doping semiconductor material portion 36' may have a variable thickness that changes as a function of a depth from the topmost surface of the single crystalline semiconductor material layer 10. The electrical dopants diffuse further inward from the facet regions of the graded-doping semiconductor material portions 36' so that the source/drain extension regions 32 extend further inward from p-n junctions caused by the diffusion of electrical dopants during the anneal.

The junction profile obtained through the methods of the present disclosure can be very sharp, and is not rounded as would be obtained by ion implantation and rapid thermal anneal as known in the art. Thermal diffusion of electrical dopants from the doped semiconductor material portions 38 having a high atomic concentration of the electrical dopant can provide a new type of profile for the source/drain extension regions 32, which was not possible through prior art methods. The improved extension profile provided by the source/drain extension regions 32 of the present disclosure is close to the shape of the faceted surfaces 36F of the graded-doping semiconductor material portion 36'.

In one embodiment, the temperature of the anneal may be selected such that the dopant diffusion from the doped semiconductor material portion 38 can dominate over the influence of the shape of the source/drain extension regions 32 as formed at the processing step of FIG. 3. In this case, the junction profile of the source/drain extension regions 32, as modified by the anneal at the processing step of FIG. 9, can be very abrupt. In one embodiment, a vertical cross-sectional shape of the source/drain extension regions 32 may be triangular.

The junction profile provided by the source/drain extension regions 32 of the present disclosure can provide a good link-up to channel (and hence, a low on-state resistance for the field effect transistor) and also very good short channel behavior (i.e., less severe short channel effects). The diffusion of the electrical dopants from the doped semiconductor material portions 38 through the triangular portions (faceted portions) of the graded-doping semiconductor material portion 36' into the source/drain extension regions 32 prior to the anneal and into the single crystalline semiconductor material layer 10 can dominate, and overcome, the junction profile as provided by ion implantation. The junction profile between the source/drain extension regions 32 after the anneal and the remaining portion of the single crystalline semiconductor material layer 10 can be more abrupt (i.e., have a greater dopant gradient), and hence provide superior performance to the field effect transistor.

A material junction between the first semiconductor material and the second semiconductor material is present at the interface between each graded-doping semiconductor material portion 36' and the combination of the single crystalline semiconductor material layer 10 and the source/drain extension regions 32. The location of the p-n junction may, or may not be coincident with any portion of the material junction. In one embodiment, the anneal may diffuse the electrical dopants of the second conductivity type from the doped semiconductor material portions 38 into the source/drain extension regions 32 so that the volume of the source/drain extension regions 32 expands. Each p-n junction extends along, or around, the interface between a graded-doping semiconductor material portion 36' and the single crystalline semiconductor material layer 10. The p-n junction may coincide with portions of the interface between a graded-doping semiconductor material portion 36' and the single crystalline semiconductor material layer 10, or may be inside the single crystalline semiconductor material layer 10, or may be within the graded-doping semiconductor material portions 36'.

Optionally, source/drain metal-semiconductor alloy portions 63 can be optionally formed by reacting a metal with surface portions of the doped semiconductor material portions 38 at an elevated temperature. If the gate conductors 52 include a semiconductor material, the gate cap dielectrics 56 can be removed, for example, by a wet etch, and upper portions of the gate conductors 52 can be reacted with a metal to form gate-side metal-semiconductor alloy portions 75 on top of the gate conductor 52. In this case, the formation of the source/drain metal-semiconductor alloy portions 63 and the formation of the gate-side metal-semiconductor alloy portions 75 can be performed simultaneously during the same anneal process.

A contact-level dielectric material layer 80 can be deposited and planarized. The contact-level dielectric material layer 80 includes a dielectric material such as silicon nitride, silicon oxide, organosilicate glass, or a combination thereof. The contact-level dielectric material layer 80 can be deposited, for example, by chemical vapor deposition or spin-coating.

Various contact via structures can be formed in the contact-level dielectric material layer 80. For example, the various contact via structures can include source/drain contact via structures 82, each of which is conductively connected to a source/drain (36, 38), which includes a stack of an stress-generating semiconductor material portion 36 and an doped semiconductor material portion 37. Further, the various contact via structures can include gate contact via structures 85, each of which is conductively connected to a gate conductor 52.

Figure 10:
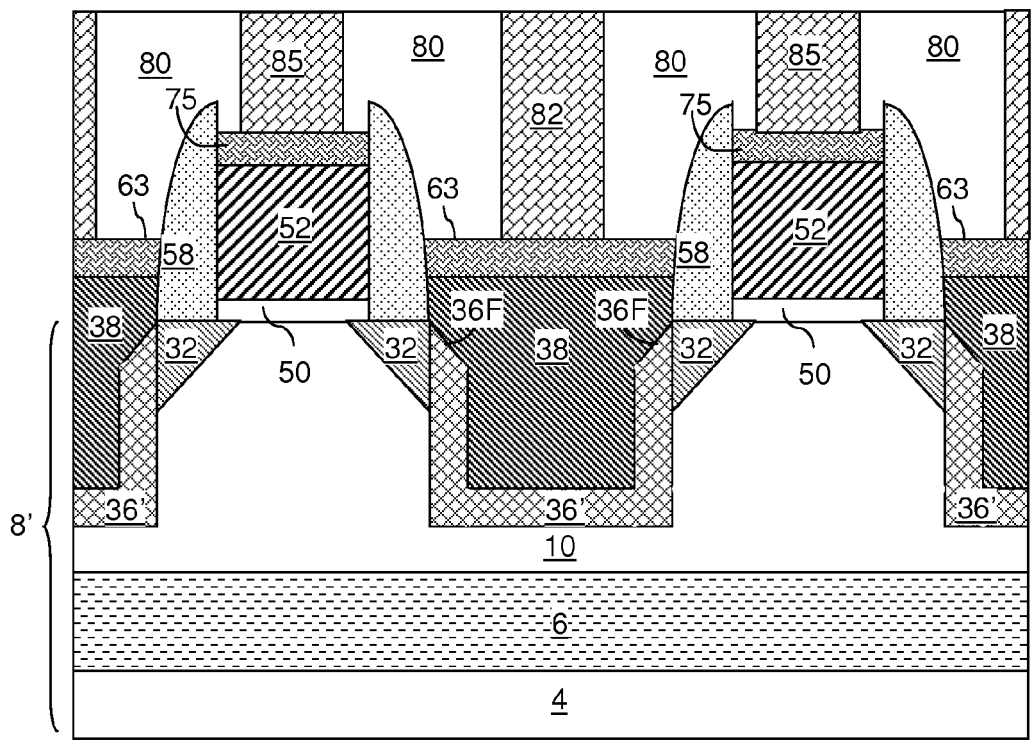
FIG. 10 is a vertical cross-sectional view of a first variation of the first exemplary semiconductor structure according to an embodiment of the present disclosure.

The present invention may be practiced with numerous variations. Referring to FIG. 10, a semiconductor-on-insulator (SOI) substrate 8' may be employed in lieu of a bulk semiconductor substrate in a first variation of the first exemplary semiconductor structure. In this case, the SOI substrate 8' includes a buried insulator layer 6 and a handle substrate 4. In one embodiment, the distance between the bottom surfaces of the trenches 29 (See FIG. 5) and the top surface of the buried insulator layer 6 may be minimized without physically exposing the top surface of the buried insulator layer 6 so as to enhance the stress applied to the channel region.

Figure 11:
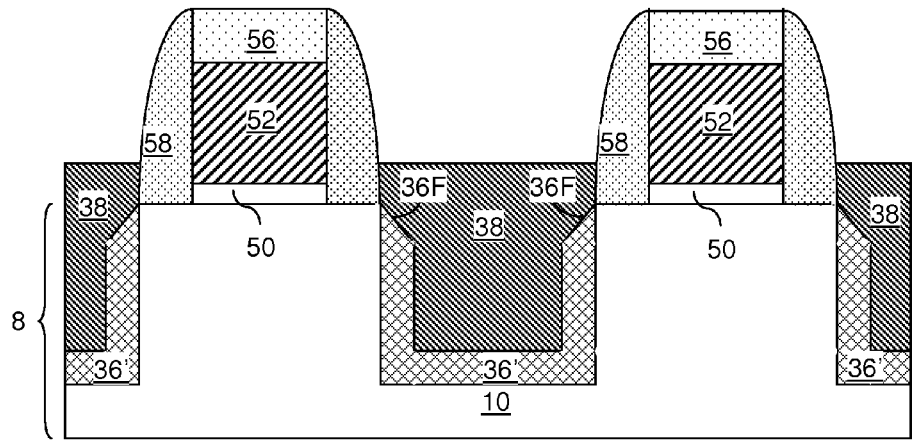
FIG. 11 is a vertical cross-sectional view of a second variation of the first exemplary semiconductor structure after a second selective epitaxy process according to an embodiment of the present disclosure.

Referring to FIG. 11, a second variation of the first exemplary semiconductor structure can be derived from the first exemplary semiconductor structure by formation of source/drain extension regions 32 and performing processing steps corresponding to FIGS. 1-8. In this case, source/drain extension regions are not formed at least until the completion of the first selective epitaxy process.

Figure 12:
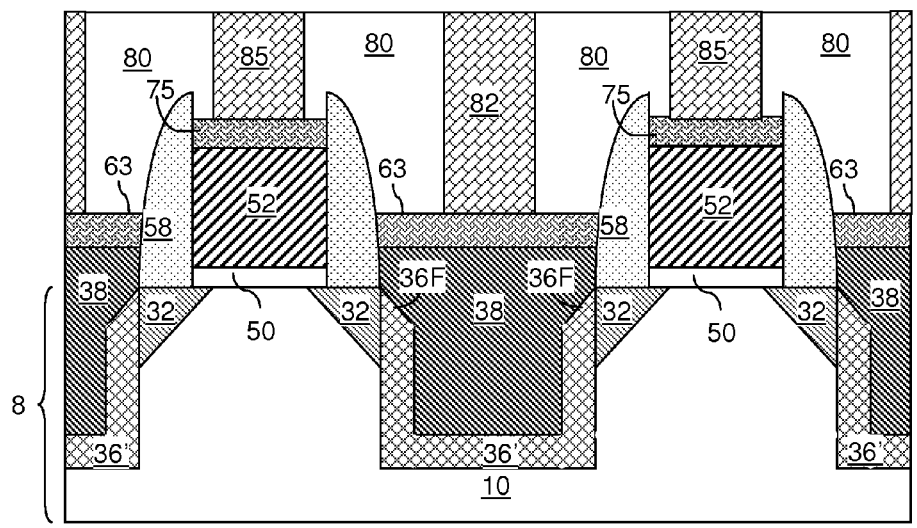
FIG. 12 is a vertical cross-sectional view of the second variation of the first exemplary semiconductor structure after formation of a contact-level dielectric material layer and contact via structures according to an embodiment of the present disclosure.

Referring to FIG. 12, source/drain extension regions 32 are formed by diffusion dopants of the second conductivity type from the doped semiconductor material portions 38 through thin portions (facet-including portions) of the stress-generating semiconductor material portions 36 while the stress-generating semiconductor material portions 36 become converted into graded-doping semiconductor material portions 36' during an anneal. Each corner region at which a faceted surface 36F contacts an edge of the gate spacer 58 (which is the only spacer in this case) is employed as a conduit for diffusion of dopants of the second conductivity type into corner portions of the single crystalline semiconductor material layer 10 and to convert portions of the single crystalline semiconductor material layer 10 into source/drain extension regions 32. The processing steps of FIG. 9 can be subsequently performed.

Figure 13:
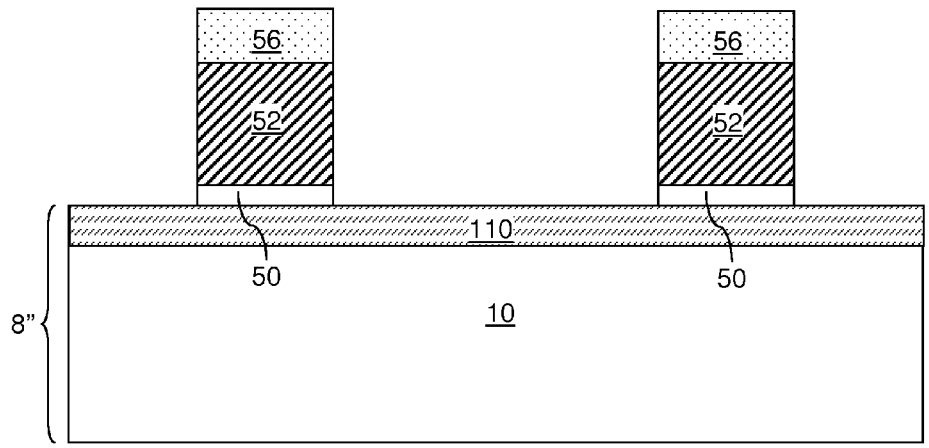
FIG. 13 is vertical cross-sectional view of a second exemplary semiconductor structure after formation of a lattice mismatched semiconductor material layer and gate stacks according to an embodiment of the present disclosure.

Referring to FIG. 13, a second exemplary semiconductor structure can be derived from the first exemplary structure by employing a composite semiconductor substrate 8" instead of the semiconductor substrate 8 in the first exemplary semiconductor structure. Specifically, a lattice mismatched semiconductor material layer 110 can be formed on the top surface of the single crystalline semiconductor material layer 10 prior to forming the shallow trench isolation structures (not shown) or a gate dielectric layer 50L (See FIG. 1). The lattice mismatched semiconductor material layer 110 includes a single crystalline semiconductor material that is different from, and lattice mismatched with respect to, the first semiconductor material of the single crystalline semiconductor material layer 10. For example, the single crystalline semiconductor material layer 10 can be a single crystalline silicon layer, and the lattice mismatched semiconductor material layer 110 can be a single crystalline silicon germanium alloy layer. In one embodiment, the field effect transistor formed employing the single crystalline silicon germanium alloy layer may be a p-type field effect transistor (PFET) including a silicon-germanium alloy channel, i.e., a SiGe PFET. A silicon-germanium alloy channel for a PFET can provide a suitable work function and an additional mobility benefit because a silicon-germanium alloy provides a greater hole mobility than silicon. The lattice mismatched semiconductor material layer 110 may be intrinsic, or may have the same type of doping as the single crystalline semiconductor material layer 10 if the single crystalline semiconductor material layer is doped. The thickness of the lattice mismatched semiconductor material layer 110 can be in a range from 5 nm to 30 nm, although lesser and greater thicknesses can also be employed. After formation of the lattice mismatched semiconductor material layer 110, the processing steps of FIGS. 1 and 2 can be performed.

Figure 14:
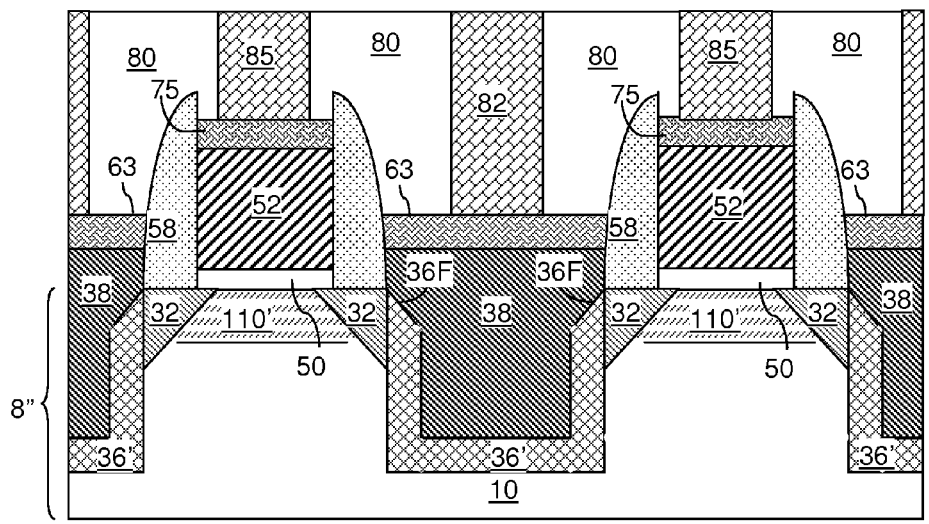
FIG. 14 is a vertical cross-sectional view of the second exemplary semiconductor structure after formation of a contact level dielectric layer and various contact via structures according to an embodiment of the present disclosure.

Referring to FIG. 14, the processing steps of FIGS. 4-9 can be subsequently performed. Field effect transistors formed by this method includes a lattice mismatched channel regions 110', which are remaining portions of the lattice mismatched semiconductor material layer 110 and are located between source/drain extension regions 32. At least a portion of each source/drain extension region 32 can include the same semiconductor material as the semiconductor material of the lattice mismatched semiconductor material layer 110. The lattice mismatched channel regions 110' can provide enhanced charge carrier mobility in some types of field effect transistors.

Figure 15:
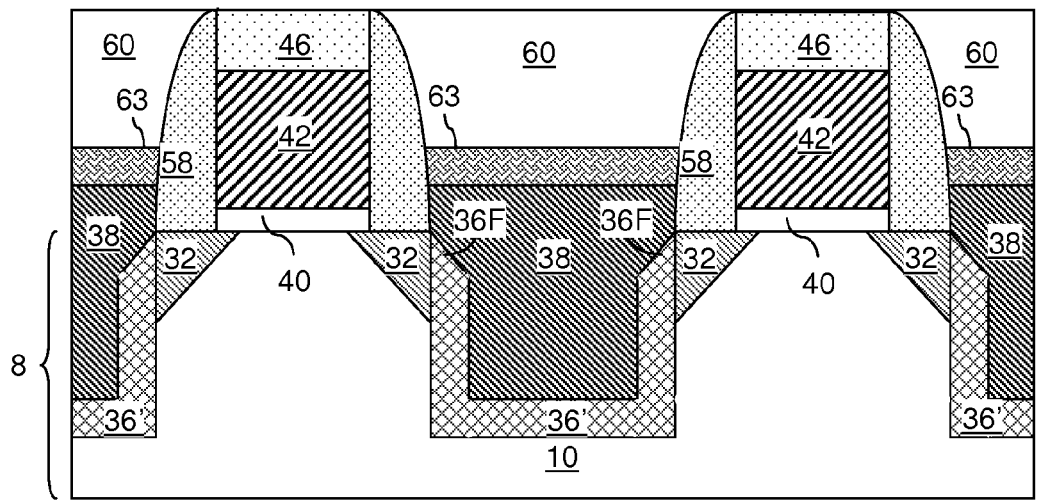
FIG. 15 is a vertical cross-sectional view of a third exemplary semiconductor structure employing disposable gate stacks after planarization of a planarization dielectric layer according to an embodiment of the present disclosure.

The methods of the present disclosure can be employed in conjunction with a replacement gate integration scheme. Referring to FIG. 15, a third exemplary semiconductor structure according to the present disclosure by forming disposable gate stack instead of gate stacks (50, 52, 56) illustrated in FIG. 2. The processing steps of FIGS. 1 and 2 are modified to form the disposable gate stacks. Each disposable gate stack includes a disposable gate dielectric 40 including a dielectric material such as silicon oxide; a disposable gate material portion 42 including a disposable material such as polysilicon, a polycrystalline silicon-germanium alloy, another disposable semiconductor material, a disposable metallic material, or a disposable dielectric material; and a disposable dielectric cap 46 including a disposable dielectric material such as silicon nitride. After the processing steps of FIG. 8, a planarization dielectric material layer 60 including a dielectric material such as silicon oxide is deposited over the disposable gate stacks (40, 42, 46), and is planarized employing the disposable dielectric caps 46 as an etch stop layer.

Figure 16:
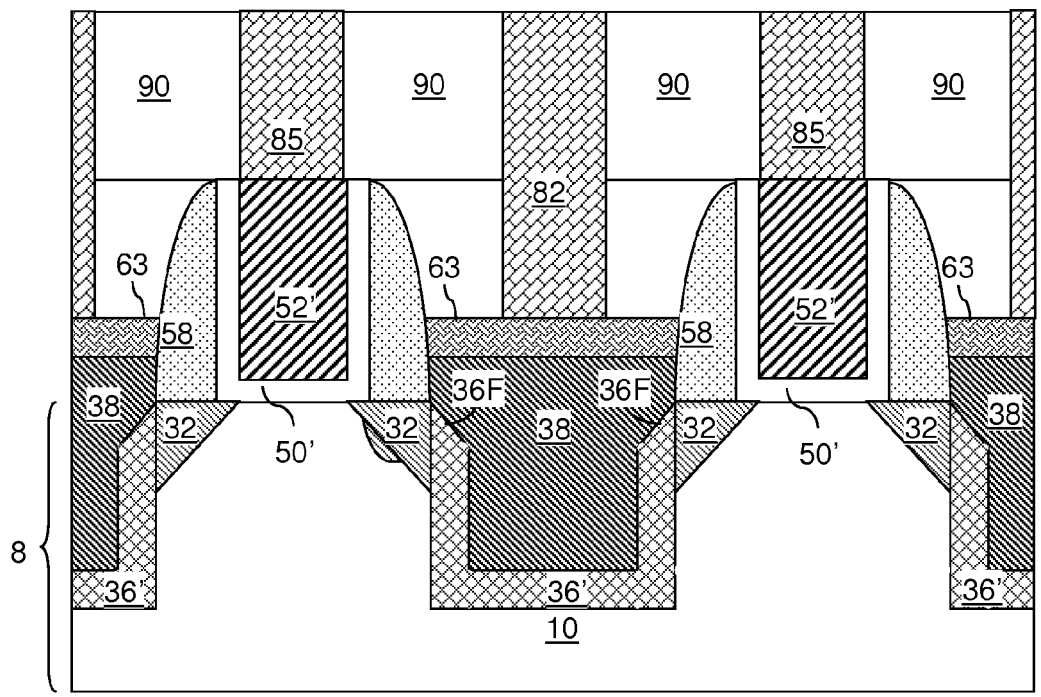
FIG. 16 is a vertical cross-sectional view of the third exemplary semiconductor structure after formation of replacement gate stacks, a contact level dielectric layer, and various contact via structures according to an embodiment of the present disclosure.

Referring to FIG. 16, the disposable gate stacks (40, 42, 46) are removed selective to the planarization dielectric material layer 60 to form gate cavities. A replacement gate structure (50', 52') including a gate dielectric 50' and a gate electrode 52' are formed in each gate cavity by deposition of a gate dielectric layer and a conductive material layer, and removal of portions of the conductive material layer ad the gate dielectric layer from above the top surface of the planarization dielectric material layer 60. A contact level dielectric layer 90 is deposited over the planarization dielectric material layer 60, and various contact via structures are formed through the contact level dielectric layer 90 and the planarization dielectric material layer 60. The various contact via structures may include source/drain contact via structures 82 and gate contact via structures 85.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a trench located in a single crystalline semiconductor material layer;
   a graded-doping semiconductor material portion located on sidewalls and a bottom surface of said trench and epitaxially aligned to said single crystalline semiconductor material layer, said graded-doping semiconductor material portion including a faceted surface that is inclined upwardly toward an edge of a vertical sidewall of said trench such that said faceted surface adjoins a topmost portion of said vertical sidewall at an edge and having a gradient in a dopant concentration; and
   a doped semiconductor material portion located on said graded-doping semiconductor material portion and protruding above said trench and epitaxially aligned to said graded-doping semiconductor material portion, wherein said doped semiconductor material portion is spaced from said single crystalline semiconductor material layer by said graded-doping semiconductor material portion.

2. The semiconductor structure of claim 1, wherein said graded-doping semiconductor material portion includes a tapered region including said faceted surface, a uniform-width vertical portion having a first uniform width that is invariant under translation along a vertical direction, and a uniform-width horizontal portion having a second uniform width that is invariant under translation along a horizontal direction.

3. The semiconductor structure of claim 2, wherein said doped semiconductor material portion contacts said faceted surface, a vertical sidewall of said graded-doping semiconductor material portion, and a horizontal surface of said graded-doping semiconductor material portion.

4. The semiconductor structure of claim 1, wherein said gradient in said dopant concentration points toward an interface between said graded-doping semiconductor material portion and said doped semiconductor material portion.

5. The semiconductor structure of claim 1, wherein said faceted surface of said graded-doping semiconductor material portion orients along a {111} plane.

6. The semiconductor structure of claim 1, further comprising:
   a gate stack contacting a top surface of said single crystalline semiconductor material layer; and
   a gate spacer contacting and laterally surrounding said gate stack.

7. The semiconductor structure of claim 6, wherein said vertical sidewall of said trench is vertically coincident with a lower portion of a sidewall of said gate spacer.

8. The semiconductor structure of claim 7, wherein said faceted surface of said graded-doped semiconductor material portion and said sidewall of said gate spacer coincide at said edge.

9. The semiconductor structure of claim 8, wherein said doped semiconductor material portion is in contact with said lower portion of said sidewall of said gate spacer.

10. The semiconductor structure of claim 6, wherein said gate stack comprises a gate dielectric and a gate conductor.

11. The semiconductor structure of claim 6, further comprising a source/drain extension region located in said single crystalline semiconductor material layer underlying said gate spacer, said source/drain extension region having a vertical cross-sectional shape of a triangle and adjoining said graded-doping semiconductor material portion.

12. The semiconductor structure of claim 1, wherein said graded-doping semiconductor material portion and said doped semiconductor material portion are lattice-mismatched with respect to said single crystalline semiconductor material layer.

13. The semiconductor structure of claim 12, wherein said graded-doping semiconductor material portion and said doped semiconductor material portion apply a stress to a channel region of said single crystalline semiconductor material layer.

14. The semiconductor structure of claim 13, wherein said single crystalline semiconductor material layer comprises silicon, said graded-doping semiconductor material portion comprises a first silicon-germanium alloy, and said doped semiconductor material portion comprises a second silicon-germanium alloy that is the same as or different from said first silicon-germanium alloy.

15. The semiconductor structure of claim 13, wherein said single crystalline semiconductor material layer comprises silicon, wherein said graded-doping semiconductor material portion comprises a first silicon-carbon alloy, and said doped semiconductor material portion comprises a second silicon-carbon alloy that is the same as or different from said first silicon-carbon alloy.

16. The semiconductor structure of claim 1, further comprising a metal-semiconductor alloy portion located on a top surface of said doped semiconductor material portion.

* * * * *